(12) United States Patent
Simon et al.

(10) Patent No.: US 7,359,030 B2
(45) Date of Patent: Apr. 15, 2008

(54) LITHOGRAPHIC APPARATUS AND DEVICE MANUFACTURING METHOD

(75) Inventors: Klaus Simon, Eindhoven (NL); Joeri Lof, Eindhoven (NL); Arthur Winfried Eduardus Minnaert, Veldhoven (NL); Erik Marie Jose Smeets, Prinsenbeek (NL)

(73) Assignee: ASML Netherlands B.V., Veldhoven (NL)

( * ) Notice: Subject to any disclaimer, the term of this patent is extended or adjusted under 35 U.S.C. 154(b) by 444 days.

(21) Appl. No.: 10/724,402

(22) Filed: Dec. 1, 2003

(65) Prior Publication Data
US 2004/0135099 A1   Jul. 15, 2004

(30) Foreign Application Priority Data
Nov. 29, 2002   (EP)   .................................. 02258278

(51) Int. Cl.
G03B 27/42   (2006.01)
G03B 27/58   (2006.01)

(52) U.S. Cl. ......................................... 355/53; 355/72

(58) Field of Classification Search ................ 355/53, 355/77, 72, 73; 250/491.1; 356/399; 436/180, 436/37; 435/5, 6; 536/25.3; 422/131, 64; 359/212
See application file for complete search history.

(56) References Cited

U.S. PATENT DOCUMENTS

| | | | |
|---|---|---|---|
| 3,573,975 A | 4/1971 | Dhaka et al. ............... 117/212 |
| 3,648,587 A | 3/1972 | Stevens ......................... 95/44 |
| 4,346,164 A | 8/1982 | Tabarelli et al. ............ 430/311 |
| 4,390,273 A | 6/1983 | Loebach et al. ............. 355/125 |
| 4,396,705 A | 8/1983 | Akeyama et al. ........... 430/326 |
| 4,480,910 A | 11/1984 | Takanashi et al. ............ 355/30 |
| 4,509,852 A | 4/1985 | Tabarelli et al. .............. 355/30 |
| 5,040,020 A | 8/1991 | Rauschenbach et al. ...... 355/53 |
| 5,121,256 A | 6/1992 | Corle et al. ................. 359/664 |
| 5,143,854 A | 9/1992 | Pirrung et al. .............. 436/518 |
| 5,610,683 A | 3/1997 | Takahashi ..................... 355/53 |
| 5,715,039 A | 2/1998 | Fukuda et al. ................ 355/53 |
| 5,825,043 A | 10/1998 | Suwa ......................... 250/548 |
| 5,900,354 A | 5/1999 | Batchelder .................. 430/395 |
| 6,040,193 A | 3/2000 | Winkler et al. ............. 436/180 |
| 6,191,429 B1 | 2/2001 | Suwa ......................... 250/548 |
| 6,236,634 B1 | 5/2001 | Lee et al. .................... 369/112 |
| 6,375,903 B1* | 4/2002 | Cerrina et al. .............. 422/131 |
| 6,426,184 B1* | 7/2002 | Gao et al. ....................... 435/6 |

(Continued)

FOREIGN PATENT DOCUMENTS

DE   206 607   2/1984

(Continued)

OTHER PUBLICATIONS

EP Search Report for EP 02258278.7 dated Oct. 22, 2003.

(Continued)

*Primary Examiner*—Peter B. Kim
(74) *Attorney, Agent, or Firm*—Pillsbury Winthrop Shaw Pittman, LLP

(57) ABSTRACT

A flowcell including a plurality of separate chambers is provided on the substrate table so that a fluid can be brought into contact with exposed areas of the substrate to interact therewith. A series of exposures and chemical processes can thereby be carried out without removing the substrate from the substrate table.

19 Claims, 5 Drawing Sheets

U.S. PATENT DOCUMENTS

| | | | |
|---|---|---|---|
| 6,560,032 B2 | 5/2003 | Hatano | 359/656 |
| 6,600,547 B2 | 7/2003 | Watson et al. | |
| 6,603,130 B1 | 8/2003 | Bisschops et al. | 250/492.1 |
| 6,633,365 B2 | 10/2003 | Suenaga | 355/53 |
| 2002/0020821 A1 | 2/2002 | Van Santen et al. | 250/492 |
| 2002/0041420 A1 | 4/2002 | Garner | 359/212 |
| 2002/0163629 A1 | 11/2002 | Switkes et al. | 355/53 |
| 2003/0123040 A1 | 7/2003 | Almogy | 355/69 |
| 2003/0174408 A1 | 9/2003 | Rostalski et al. | 359/642 |
| 2004/0000627 A1 | 1/2004 | Schuster | |
| 2004/0021844 A1 | 2/2004 | Suenaga | |
| 2004/0043494 A1* | 3/2004 | Amorese et al. | 436/37 |
| 2004/0075895 A1 | 4/2004 | Lin | 359/380 |
| 2004/0109237 A1 | 6/2004 | Epple et al. | |
| 2004/0119954 A1 | 6/2004 | Kawashima et al. | 355/30 |
| 2004/0125351 A1 | 7/2004 | Krautschik | 355/53 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 7-506561 | 7/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 11-315095 | 11/1999 |
| JP | 2000-058436 | 2/2000 |
| JP | 2001-091849 | 4/2001 |
| JP | 2004-193252 | 7/2004 |
| WO | WO99/49504 | 9/1999 |
| WO | WO 02/18823 A1 | 3/2002 |
| WO | WO 02/072264 A1 | 9/2002 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", MIT Lincoln Lab, Orlando Jan. 2001, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

Cerrina et al., "Biological lithography: development of a maskless microarray synthesizer for DNA chips", Microelectronic Engineering 61-62:33-40 (2002).

Singh-Gasson et al., "Maskless fabrication of light-directed oligonucleotide microarrays using a digital micromirror array", Nature Biotechnology 17:974-978 (1999).

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

European Search Report for EP 03257496.4.

H. Hogan, "New Semiconductor Lithography Makes a Splash", Photonics Spectra, Photonic TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Japanese Office Action issued for Japanese Patent Application No. 2003-399185, dated Feb. 19, 2007.

European Search Report for EP 03257496.4 Mar. 2004.

* cited by examiner

LITHOGRAPHIC APPARATUS AND DEVICE MANUFACTURING METHOD

BACKGROUND OF THE APPLICATION

This application claims priority to EP02258278.7, filed Nov. 29, 2002, the entire contents of which is incorporated herein by reference.

BACKGROUND OF THE INVENTION

1. Field of the Invention

The present invention relates to a lithographic apparatus, particularly to such apparatus adapted to manufacture so-called "bio-chips", and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning structure, such as a mask, may be used to generate a circuit pattern corresponding to an individual layer of the IC, and this pattern can be imaged onto a target portion (e.g comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In so-called "gene-chips" and other bio-chemical or fluidic MEMS (micro-electro-mechanical systems) it is necessary to attach specific biological or chemical compounds to specific areas on a substrate and in some cases it may be desirable to build up specific DNA sequences on the substrate. To create a small device capable of performing a large number of tests, a correspondingly large number of different compounds must be attached in their respective areas, which may be of the order of 1–100 μm in size. Existing photolithographic apparatus designeded for advanced semiconductor manufacture or manufacture on large area substrates, e.g for flat panel displays, are not designed for this type of work.

Devices for manufacturing gene-chips by the selective photo-catalysation of reactions in order to build up DNA sequences on portions of a substrate have been disclosed in U.S. Patent Application Publication 2002/0041420; "Maskless fabrication of light-directed oligonulceotide microarrays using a digital micromirror array" by S. Singh-Gasson et al, Nature Biotechnology Vol17 October 1999 pp 974–978; and "Biological lithography: development of a maskless microarray synthesizer for DNA chips" by F. Cerrina et al, Microelectronic Engineering 61–62 (2002) pp33–40. However, the devices described therein are not suitable for large-scale manufacture of devices with acceptable throughput.

SUMMARY OF THE INVENTION

It is an aspect of the present invention to provide a lithographic projection apparatus for manufacture of micro-meter or smaller scale devices by locally selective chemical reaction, preferably with high throughput.

This and other aspects are achieved according to the invention in a lithographic projection apparatus including a radiation system configured to supply a projection beam of radiation; a patterning structure configured to pattern the projection beam according to a desired pattern; a substrate table configured to hold a substrate; a projection system configured to project the patterned beam onto a target portion of the substrate; and a fluid processing cell in fluid communication with a surface of a substrate held on the substrate, wherein a fluid can be brought into contact with the substrate so as to interact with the target portion, the fluid processing cell includes a plurality of separate chambers in fluid communication with respective areas of a substrate held on the substrate table, and different areas of the substrate may be subjected to different fluid or exposure processes simultaneously.

The fluid processing cell provided on the substrate table enables processes to be carried out on the substrate, before during and after an exposure without removing the substrate from the apparatus. For example, the patterned irradiation of the substrate may selectively activate the surface thereof so that compounds, e.g. in solution, bond to the surface where it was activated but not elsewhere. Multiple separate chambers in the flowcell enable fluid processes to be carried out in parallel with exposures, increasing throughput, especially where a fluid process and the flushing of the chamber take a significant period of time.

The fluid brought into contact with the substrate may comprise a gas, a vapor or a liquid, e.g. a solution, a suspension or an emulsion. The interaction with the substrate may involve: a chemical reaction with the substrate surface or compounds thereon; removal of part of the substrate or compounds thereon; addition of compounds to the substrate; washing; or modification of the surface or atomic or electronic structure of the substrate or compounds adhered thereto. A fluid processing may be carried out before an exposure, e.g. to prime a layer of the substrate or deposit a radiation sensitive layer, during an exposure, e.g. to perform a reaction catalyzed by radiation, or after an exposure, e.g. to react selectively to parts of the target portion sensitized by the exposure radiation.

In an exemplary embodiment of the invention, the fluid processing cell includes a plate member having walls projecting therefrom to contact the substrate to define the plurality of chambers. Such a construction is simple to manufacture and allows the separate chambers to be spaced as close as possible together. The plate member can be integrated into the substrate table, e.g. forming a pimple table, or placed on the substrate on the substrate table to form all chambers in a single process.

The plate member may have within it a plurality of fluid channels communicating with the chambers obviating the need for separate pipework to connect to the chambers and simplifying the connections to the chambers. The channels in the plate member may register with fluid channels integral in the substrate table, allowing reliable, leak-free connections to be made very simply.

The fluid processing cell may be located in the substrate table underneath the substrate, i.e. on the opposite side than the projection system, for use with transparent substrates. Alternatively, the fluid processing cell may be above the substrate and formed with a transparent upper wall. If the fluid processing cell is above the substrate, the upper wall may be omitted for use with liquids not sensitive to air and gravity used to confine the liquid to the chamber.

The fluid processing cell is preferably integrated into the substrate table and substrates are loaded onto it in the machine. With this arrangement, known substrate handling devices and techniques may be used. The fluid processing cell may instead be separable from the substrate table whereby a substrate is attached to the fluid processing cell before the cell and substrate are together loaded onto the substrate table. Off-line mounting of the substrates allows an improved seal to the fluid processing cell to be formed. A further alternative is to mount the substrate on the substrate then place the fluid processing cell on the substrate and/or substrate table.

In another exemplary embodiment of the invention, the fluid processing cell is provided with a fluid inlet and fluid outlet and the height of the cell decreases from the inlet toward the outlet, wherein capillary forces assist in removal of fluid from the cell.

According to a further aspect of the invention there is provided a device manufacturing method including providing a substrate to a substrate table in a lithographic projection system; providing a projection beam of radiation using a radiation system; using a patterning structure to endow the projection beam with a pattern in its cross-section; projecting the patterned beam of radiation onto a target portion of the layer of radiation-sensitive material; and processing an area of the substrate by exposing it to a fluid that interacts therewith to effect a process step while the substrate is held by the substrate holder, wherein the area of the substrate does not include the target portion and the projecting and processing are carried out at least partially simultaneously.

Although specific reference may be made in this text to the use of lithographic apparatus in the manufacture of gene-chips, it should be understood that the lithographic apparatus described herein may have other applications, such as the manufacture of MEMS, MOEMS, Bio-MEMS, ICs, integrated optical systems, guidance and detection patterns for magnetic domain memories, liquid-crystal displays (LCDs), thin-film magnetic heads, etc. One of ordinary skill will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 435, 410, 365, 248, 193, 157 or 126 nm) and extreme ultra-violet (EUV) radiation (e.g. having a wavelength in the range of 5–20 nm), as well as particle beams, such as ion beams or electron beams.

The term "patterning structure" used herein should be broadly interpreted as referring to structure that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning structure may be transmissive or reflective. Examples of patterning structure include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning structure, the support structure may be a frame or table, for example, which may be fixed or movable as required and which may ensure that the patterning structure is at a desired position, for example with respect to the projection system. Any use of the terms "reticle" or "mask" herein may be considered synonymous with the more general term "patterning structure".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the present invention will now be described, by way of example only, with reference to the accompanying schematic drawings in which.

DETAILED DESCRIPTION

Figure 1:
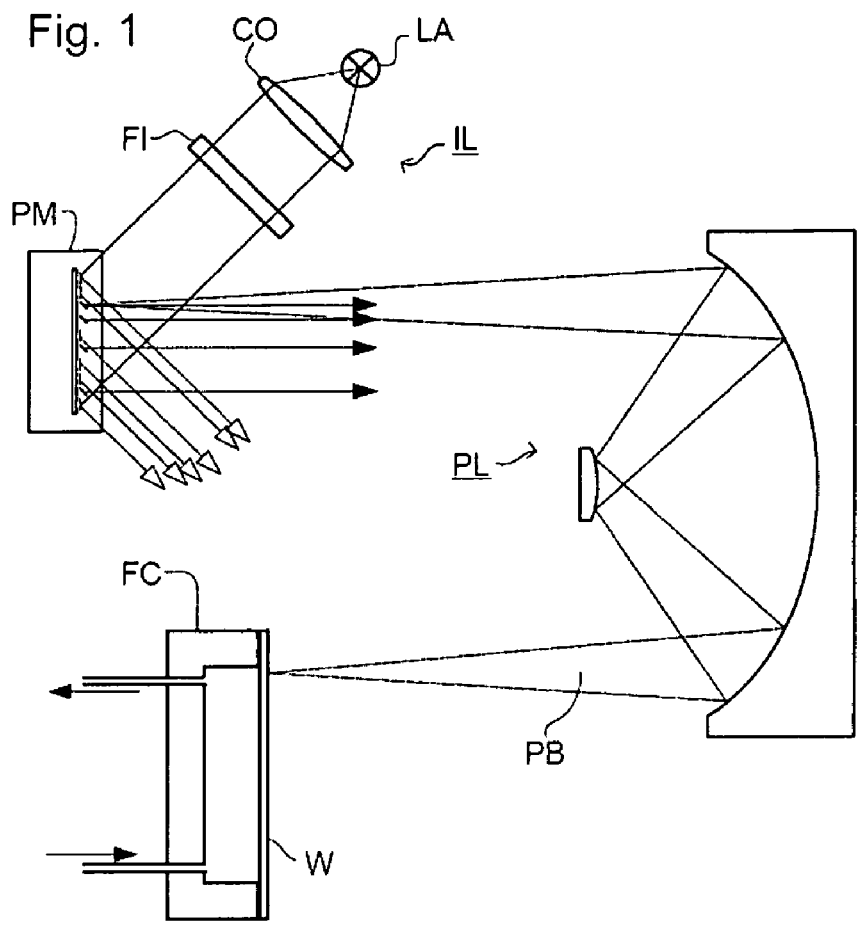
FIG. 1 depicts a lithographic projection apparatus according to an embodiment of the invention.

FIG. 1 schematically depicts a lithographic projection apparatus including a radiation system configured to supply a projection beam PB of radiation (e.g UV radiation). The radiation system includes an illumination system (illuminator) IL. In this particular case, the radiation system also includes a radiation source LA. A patterning structure PM (e.g a deformable micro-mirror array) is configured to impart a desired pattern to the projection beam. An object table (substrate table) is provided with a substrate holder configure to hold a substrate W (e.g. a resist-coated silicon wafer), and is connected to second positioning device (not shown) configured to accurately position the substrate with respect to the projection system PL or the projection beam PB.

The projection system ("lens") PL (e.g. a refractive lens system) is configured to image an irradiated portion of the patterning structure onto a target portion (e.g. includinging one or more dies) of the substrate W.

As here depicted, the apparatus is of a reflective type (e.g. has a reflective patterning structure). However, in general, it may also be of a transmissive type, for example (e.g. with a transmissive patterning structure such as an LCD array)

The source LA (e.g an Hg lamp) produces a beam of radiation. This beam is fed into an illumination system (illuminator) IL, either directly or after having traversed a conditioning device, such as a beam expander. The illuminator IL may include a filter FI to filter out undesirable wavelengths, and a condenser CO. In this way, the beam PB impinging on the patterning structure PM has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g with the aid of suitable directing mirrors). This latter scenario is often the case when the source LA is an excimer laser. An Hg lamp and liquid light guide, for example as described in European Patent Application EP-A-1 256 848, may also be used. The present invention encompasses all of these scenarios.

Having been selectively reflected by the patterning structure PM, the beam PB passes through the lens PL, which focuses the beam PB onto a target portion of the substrate W. With the aid of the positioning device, the substrate table WT can be moved accurately, e.g so as to position different target portions C in the path of the beam PB. In general, movement of the object table WT can be realized with the aid of a long-stroke module (coarse positioning) and a short-stroke module (fine positioning), which are not explicitly depicted in FIG. 1. The patterning structure may just be connected to a short stroke actuator, or may be fixed.

The pattern to be imaged onto the substrate is provided to the patterning structure which, in the case of a deformable micro-mirror array, sets its mirrors to selectively direct light into the projection system PL according to the pattern.

The depicted apparatus can be used in two different modes:

1. In step mode, the pattern displayed by the patterning structure is kept essentially stationary, and an entire image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the patterning structure displays a scanning pattern with a speed v in a scanning direction; concurrently, the substrate table WT is simultaneously moved in the same or opposite direction at a speed V=Mv, in which M is the magnification of the lens PL (M may be from 1 to $\frac{1}{10}$). In this manner, a relatively large target portion C can be exposed, without having to compromise on resolution.

The substrate table WT additionally includes a fluid processing unit FC (also referred to as a flowcell) by which a chemical process can be carried out on the substrate W. This is shown in more detail in FIG. 2. After each exposure, a fluid flushes out the flowcell. For example, the fluid may contain one of the nitrogenous bases out of which DNA is build: Adenine, Cytosine, Guanine or Thiamine. A desired DNA sequence can thus be assembled on the substrate. To remove the fluid, the flowcell is flushed out with dry Argon. During a process to build a DNA sequence, any exposure of the substrate to air is not allowed; air contains water vapor, which would disturb the DNA production process.

Figure 2:
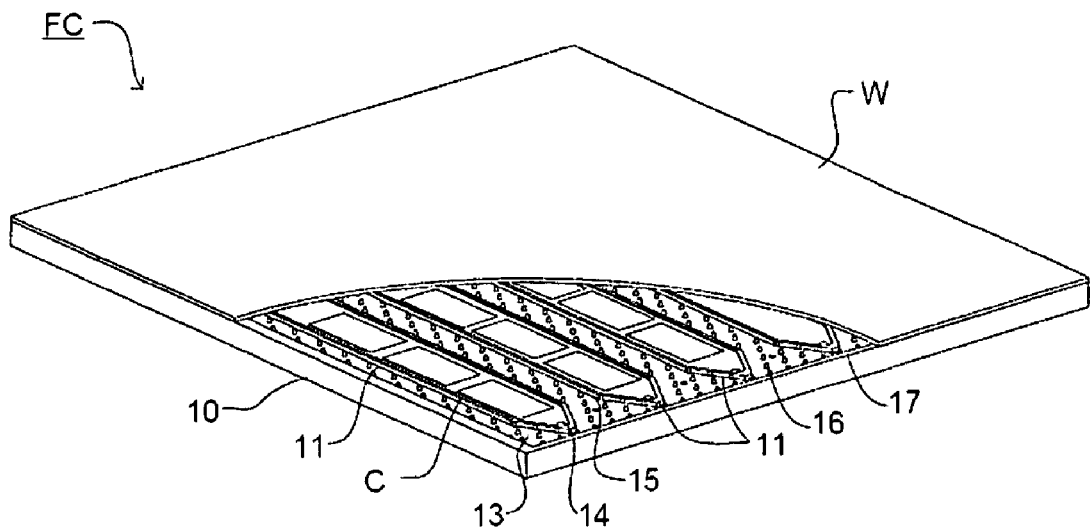
FIG. 2 depicts the fluid processing cell of the apparatus of FIG. 1 in greater detail.

FIG. 2 shows the fluid processing unit FC, which forms part of the substrate holder 10, and the substrate W, shown partly cut-away in the figure. The substrate W rests around its edges on walls 17, which bound vacuum area 13, which is evacuated to hold the substrate onto the substrate table. Pimples 16 support the substrate in a known manner. Within the vacuum area are several fluid chambers 11, formed by upstanding walls 15 of the same height as the walls 17 so that the substrate W closes the fluid chambers to form a fluid processing cell. The height and flatness of the fluid chamber walls, the pimples and the outer walls 17 are determined so that the substrate W forms an adequate seal to the fluid chamber walls under the force exerted by the pressure differential between the atmosphere above and vacuum below, without unduly distorting the substrate. The fluid chambers are elongate, in this case stretching from near one side of the substrate to near the opposite side, and encompass several target portions C. They are preferably shallow to minimize fluid consumption. At one end a fluid inlet 12 (see FIG. 4) is provided and at the other end there is a fluid outlet 14. To effect a desired process, fluid is provided to the fluid chamber via the inlet and removed via the outlet. A deliberate leak from the fluid chambers may be arranged to prevent contamination.

The vacuum system that generates the vacuum to hold the substrate down on the fluid processing unit also serves to remove any fluids that may leak from the fluid chambers, and any air that might enter the unit.

In this embodiment, the fluid processing unit is integrated into the substrate table WT and the substrate is loaded onto it using known devices, simplifying handling of the substrate. Alternatively, the fluid processing unit may be separable from the substrate table—the substrate is mounted onto the fluid processing unit outside the apparatus and then the unit and substrate are together loaded onto the substrate table. This arrangement may be advantageous in enabling a better seal between the substrate and fluid chambers to be achieved.

Figure 3:
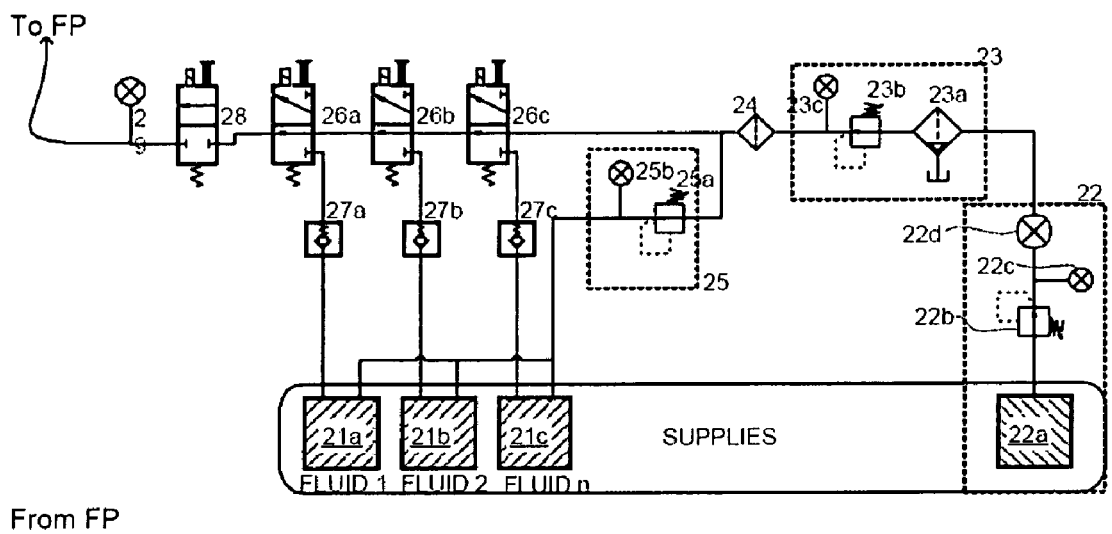
FIG. 3 depicts the fluid management system of the apparatus of FIG. 1.

A fluid management system 20 is shown in FIG. 3. The fluid processing unit is supplied by a single combined fluid/gas entry into the fluid processing unit. In this way the Argon flushing of the tubing towards the flowcell can be combined with the flushing of the flowcell itself. This minimizes the potential of 'non-flushable' cavities. To minimize the mass of the wafer table WT, the generation of heat on the table and the number of cables and hoses leading to the wafer table WT, which will need to be positioned with μm accuracy, the fluid management system is mostly located remotely of the table, with a fluid supply and a fluid extraction conduit leading to each fluid chamber 11 in the fluid processing unit FP.

The supplies of the fluid management system include a supply tank 21a,b c, etc for each fluid to be used in the apparatus and a flushing gas tank, 22a. The flushing gas, e.g Argon or Helium, is used to flush the fluid chambers 11 after each liquid process and also to replace the fluids pumped out of the supply tanks 21a,b,c, etc. One-way valves 27a–c are provided in the outlets from each of the liquid supply tanks 21a–c to prevent any dispensed fluid from returning to the tanks. The flushing gas tank 22a is equipped with a pressure regulator 22b, which brings the pressure down to a standard pressure, e.g 12 bar. A pressure sensor 22c to monitor this is provided, as well as a valve 22d for sealing the container from the outside of the system.

To filter out any particles and condensate the flushing gas is directed through a filter unit 23a. The filter unit is integrated with a pressure regulator 23b and a pressure gauge 23c. The pressure regulator reduces the pressure further so that the flushing gas can safely be used for flushing the fluid chambers 11. As a last cleaning step, the flushing gas is directed through an active carbon filter 24, which captures particles larger than 0.003 μm. A further, adjustable pressure regulation unit 25 is provided to control the pressure of the gas used to replace the fluids taken out of the fluid supply tanks 22a,b,c, etc.

To selectively connect the various supplies to the fluid processing unit FP, a series of 3/2 valves 26a–c are used these are electrically controlled and normally in a position to allow the flushing gas to flow through to the fluid processing unit FP. To deliver a liquid to the flow cell, the respective one of the 3/2 valves are opened to the fluid. A manual override to the electrical control may be provided.

Referring to FIG. 3, 2/2 valves 28, 32 in the supply and exhaust lines allows the fluid processing unit FP to be sealed if desired, e.g. if a process requires a liquid to remain in contact with the substrate for an extended period. A pressure gauge 29 monitors the pressure in the supply line to the fluid processing unit FP and can measure both liquid and gas pressures. On the output side of the fluid management system, a similar pressure gauge 30 monitors the pressure in the exhaust line from the fluid processing unit FP. A fluid detector 31 is also provided to detect whether or not fluid is flowing through the system, thereby enabling detection of an empty supply tank. The detector gives an electrical signal indicating the presence of fluids. Its exact form will depend on the fluids to be detected, e.g. hydrocarbons.

Mirroring the arrangement on the supply side, 3/2 valves 33a–c normally open to argon allow the fluids that have been flushed through the fluid processing unit to be separately collected in respective waste tanks 36a–c, to allow reuse or proper disposal. If separate collection is unnecessary, a single waste tank may be used and these valves may be omitted. Argon used for flushing and air displaced form the waste tanks 36a–c is vented using a vacuum pump via a condenser 38 to collect any evaporated liquid. One way valves 37a–c are provided in the outlets of the waste tanks to prevent environmental air form entering the waste tanks.

In this embodiment, the fluids are sucked through the fluid processing unit FP by respective pumps 34a–c for the liquids and 35 for the flushing gas. This minimizes the chance of contamination. Alternatively, the fluids might be pushed through by a pump or pumps on the supply side or by gas pressure in the supply tanks.

Where the fluid processing unit has several fluid chambers, various arrangements are possible. Most simply, all the fluid chambers may be connected in parallel so that the same liquid is supplied to them all at the same time. It may however be desirable to be able to supply fluids to the chambers separately, e.g. to apply different processes to different ones of the target areas or to allow fluid processing to occur in parallel with exposures. In that case, a switching arrangement may be provided in the fluid processing unit to control delivery of fluids form a single supply conduit to selected ones of the fluid chambers. Alternatively, several fluid management systems, one for each fluid chamber, may be provided. This provides maximum flexibility at the cost of requiring additional supply and exhaust lines to be provided to the table.

Figure 4:
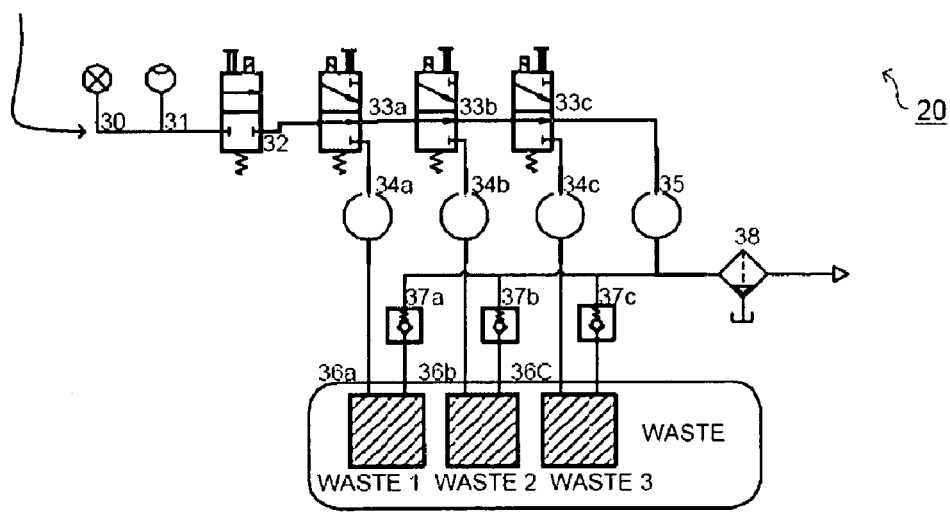
FIG. 4 is a cross-sectional view of the fluid processing cell of FIG. 2.
Figure 4:
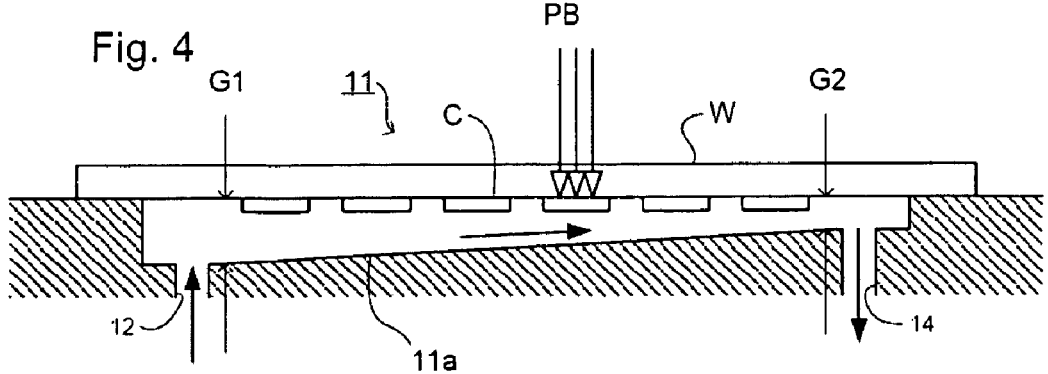

FIG. 4 is a cross-sectional view of a fluid chamber 11. As can be seen, the gap G1 between the floor 11a of the fluid chamber 11 and the substrate W near the fluid inlet is larger than the gap G2 near the outlet. Both gaps are of order 0.1 mm or less. In this way, capillary forces between the liquid and the fluid chamber and substrate will draw the fluid towards the outlet, improving fluid removal after the fluid process. Preferably, the materials of the fluid chamber and substrate are chosen so that the fluid has high adhesive forces to them and low cohesive forces. For example, if the fluid is alcohol-based, glass may be used for the flowcell and substrate.

Figure 5:
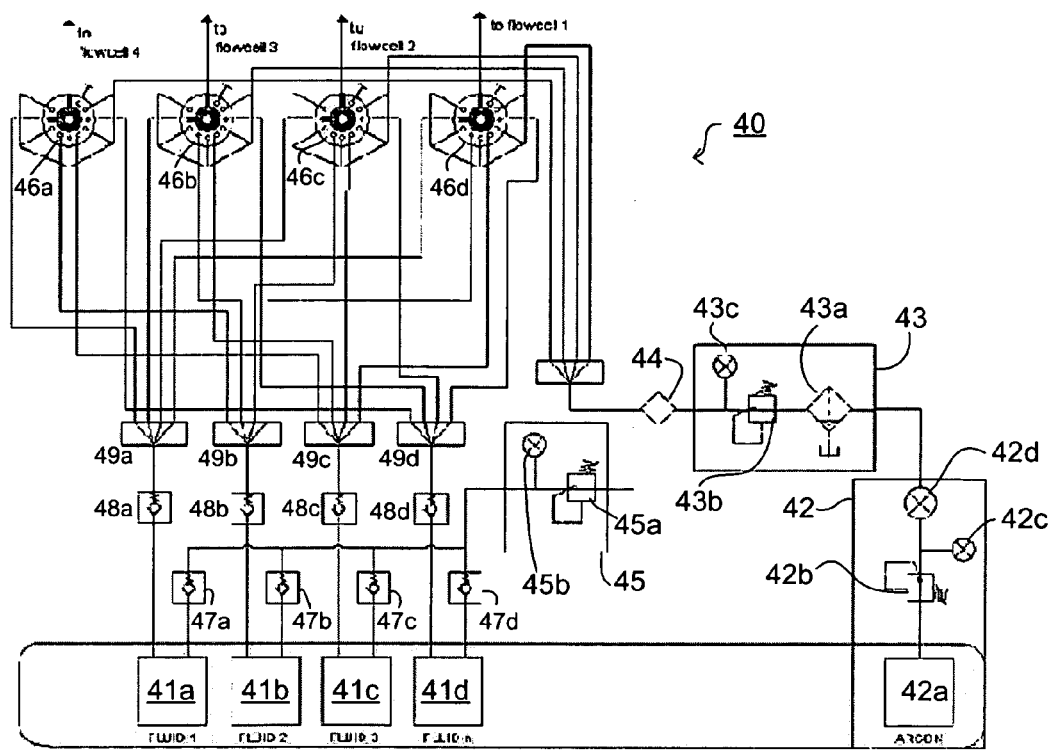
FIG. 5 depicts an alternative fluid management system.
Figure 5:
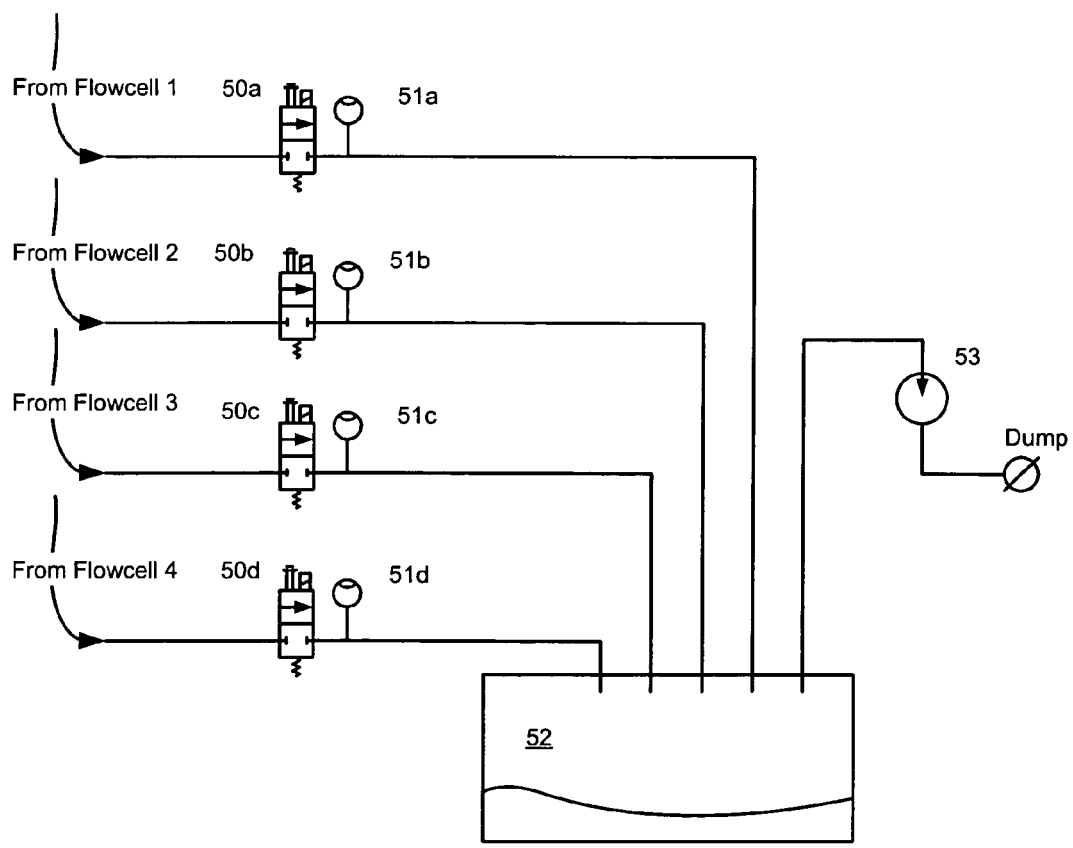

FIG. 5 shows an alternative fluid management system to supply four separate fluid chambers within the fluid processing unit. Four fluids and a flushing gas are stored in supply tanks 41a–d and 42 respectively. As in the first fluid management system, the flushing gas container 42a is provided with a pressure regulator 42b which brings the pressure down to 12 bar. A pressure gauge 42c and a valve 42d are also provided. The flushing gas supply is then provided to a filter and pressure regulator unit 43 comprising a filter unit 43a with pressure regulator 43b and pressure gauge 43c which reduces the flushing gas pressure further so that it can be used for flushing the fluid chambers. The argon is also filtered by filter 44. To take up the space in the liquid containers 41a to 41d as fluid is pumped out, the flushing gas must be reduced in pressure further and this is done by pressure regulator 45 which includes an adjustable pressure regulator 45a and pressure gauge 45b. The flushing gas enters the fluid supply tanks 41a to 41d via one-way valves 47a to 47d. The fluid supplied from fluid supply tanks 41a to 41d exit via one-way valve 48a to 48d and distribution blocks 49a to 49d which provide the fluids to four multi-position valves 46a to 46d, one per fluid chamber on the fluid processing unit. Each multi-position valve allows independent selection between one of the four fluids and the flushing gas.

On the waste side, the waste line from each fluid chamber is provided with a two-position valve 50a to 50d enabling the fluid chamber to be shut, e.g. for a process requiring extended contact with the fluid. A fluid detector 51a to 51d is also provided in each waste line. The waste fluids are collected in waste container 52, though separate containers may alternatively be used. A pump 53 is used to suck flushing gas, and fluids, through the system.

Figure 6:
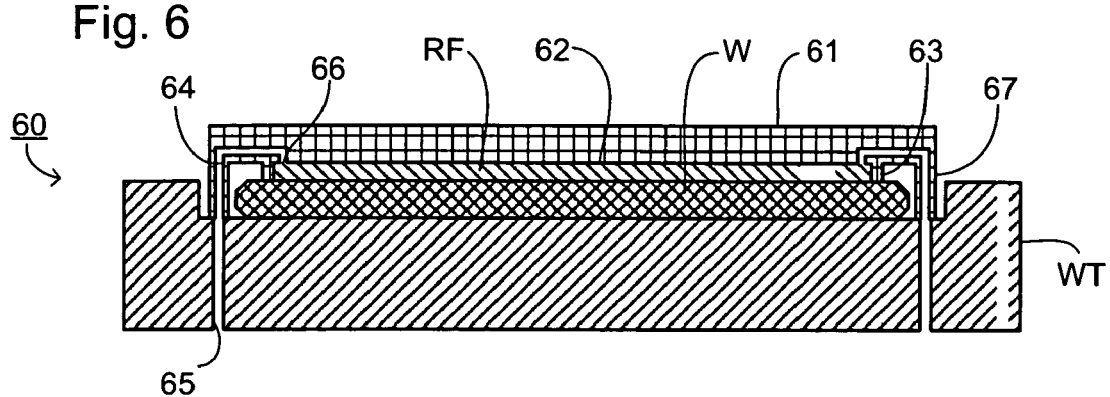
FIGS. 6 and 7 depict a fluid processing cell according to a second embodiment of the invention.
Figure 7:
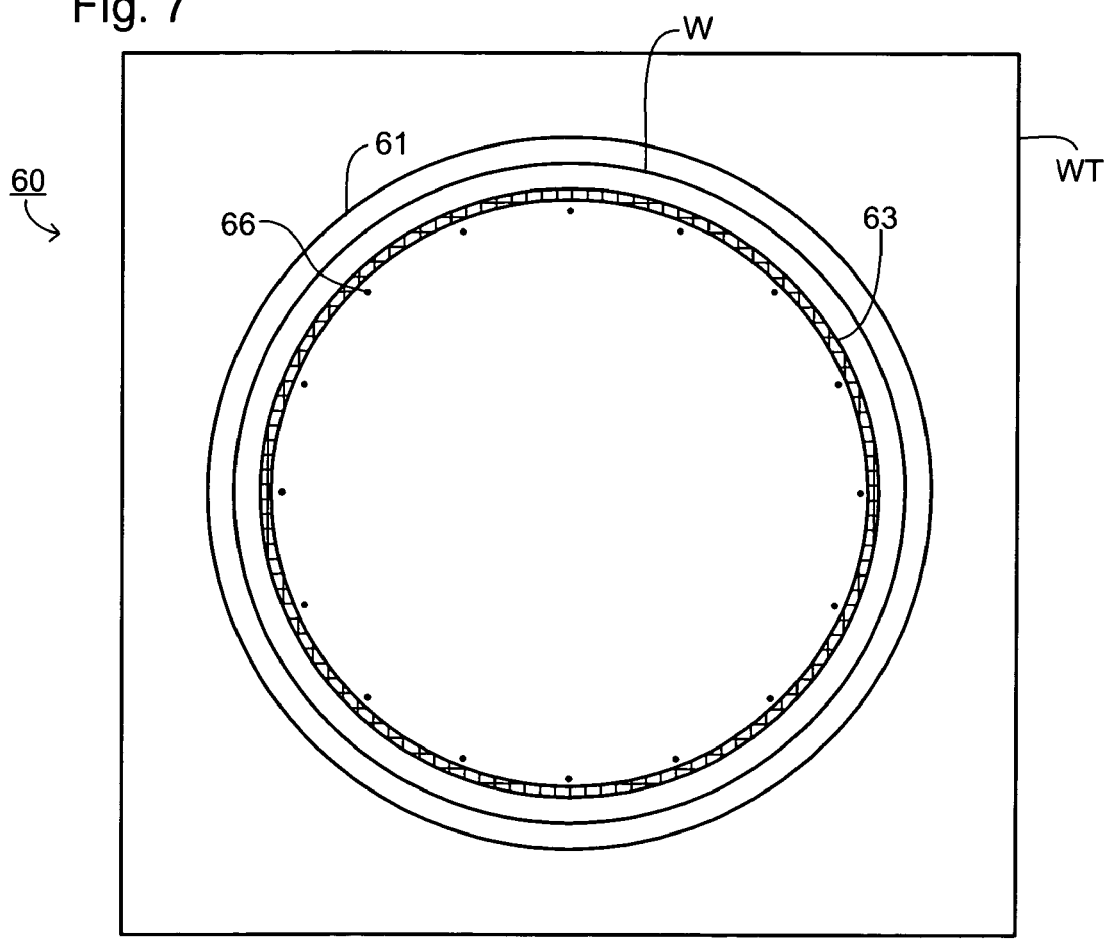

A second embodiment of the present invention employs a different fluid processing cell, shown in FIGS. 6 and 7. The remainder of the apparatus, in particular the fluid management system, may be the same as in the first embodiment.

In the fluid processing cell 60, the fluid chambers 62 are formed between a plate member 61, which is made of a material such as glass or quartz that is transparent to the radiation of the projection beam, and the substrate W. The plate member 61 has walls 63 depending from its inner surface to define the fluid chambers. In FIGS. 6 and 7 only a peripheral wall is shown, further walls subdividing the area of the substrate may be provided as convenient for a particular application, or omitted. Around the outer periphery of the plate 61 is a skirt 67 which rests on the substrate table WT outside of the substrate W. The skirt 67 has within it fluid channels 64 which communicate with the fluid chambers 62 to act as inlets and outlets for the RF. The other ends of the fluid channels 64 register with channels 65 in the substrate table WT which in turn are connected to a fluid management system as described above. O-ring seals may be provided around the ends of the channels 64 or the ends of the channels 65.

To assemble the fluid cell, the substrate W is first loaded onto the substrate table WT by a conventional substrate handling robot and is held in place by, e.g. a pimple table or electrostatic chuck. Next the plate member 61 is loaded over the substrate W. The substrate handling robot may be used for this or a separate dedicated device provided. Correct registration of the channels 64, 65 in plate member 61 and substrate table WT can be ensured by the accuracy of the robot or placement device, if necessary assisted by guide or keying arrangements. If a pimple table and vacuum are used to hold the substrate in place, the plate member 61 can also be held in place by providing a partial vacuum in the space outside the peripheral walls 63 but within the skirt 67. Alternatively, a mechanical, electromagnetic or electrostatic clamp maybe used.

To accommodate substrates of different sizes or thicknesses, plate members 61 having walls 63 and/or skirts 67 of different heights may be provided.

Figure 8:
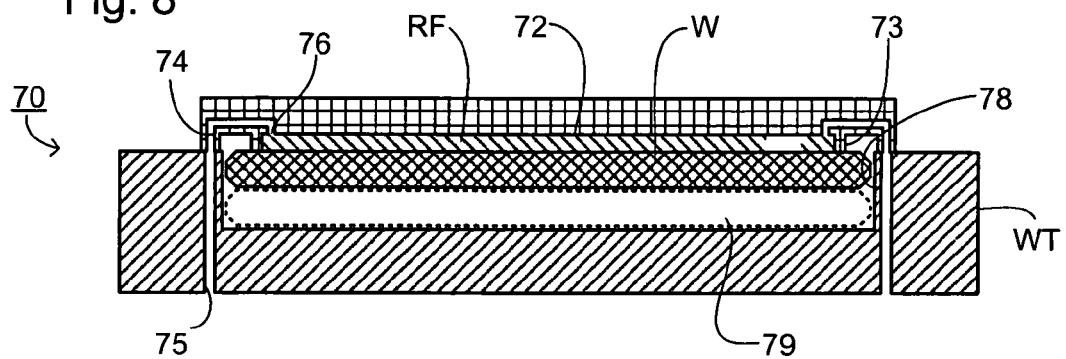
FIG. 8 depicts a fluid processing cell according to a third embodiment of the invention.

A third embodiment of the present invention is designed to accommodate substrates of different thicknesses. It is a variant of the second embodiment and is shown in FIG. 8. In that Figure, parts similar or corresponding to parts of the second embodiment are denoted by reference numerals 10 higher.

In the third embodiment, the substrate table WT is provided with a well 78 which is deep enough to accommodate the thickest substrates expected, e.g. substrates bonded to carriers. When a thinner substrate is to be used, a dummy or spacer substrate 79 of appropriate thickness to bring the top surface of the substrate W to the correct height is employed.

Figure 9:
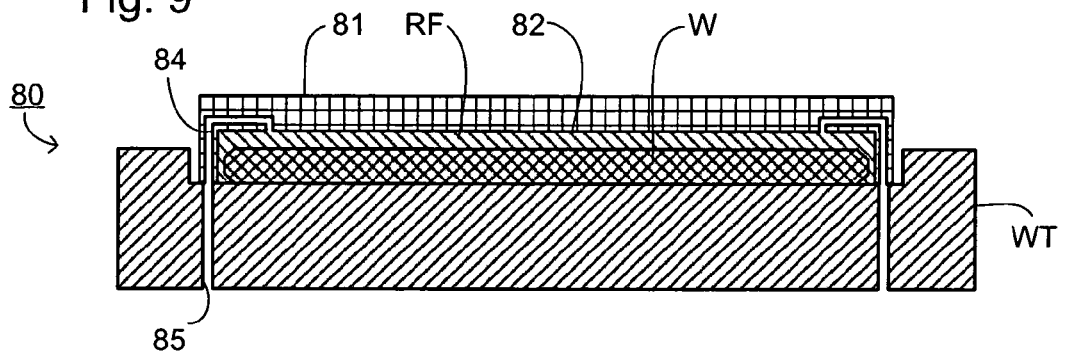
FIG. 9 depicts a fluid processing cell according to a fourth embodiment of the invention In the Figures, corresponding reference symbols indicate corresponding parts.

A fourth embodiment of the invention is shown in FIG. 9 and is again a variant of the second embodiment. Parts similar to those of the second embodiment are denoted by references 20 higher.

The fourth embodiment omits the peripheral walls 63 for simplicity and to accommodate variation in the substrate thickness. The fluid is allowed to flow over the edge of the substrate so if a pimple table and vacuum arrangement is used to hold the substrate in place, the vacuum system must be able to accept any leakage of fluid under the substrate that may occur.

While specific embodiments of the invention have been described above, it will be appreciated that the invention may be practiced otherwise than as described. The description is not intended to limit the invention.

What is claimed is:

1. A lithographic projection apparatus, comprising:
a radiation system configured to supply a projection beam of radiation;
a patterning structure configured to pattern the projection beam according to a desired pattern;
a substrate table configured to hold a substrate;
a projection system configured to project the patterned beam onto a target portion of the substrate; and
a fluid processing cell in fluid communication with a surface of a substrate held on the substrate table, wherein the fluid processing cell is configured so that a fluid can be brought into contact with the substrate so as to interact with the target portion, the fluid processing cell comprises a plurality of separate chambers in fluid communication with respective areas of a substrate held on the substrate table, and the fluid processing cell is configured so that different areas of the substrate may be subjected to different fluid processes simultaneously or to a fluid process and a radiation exposure process simultaneously.

2. An apparatus according to claim 1, wherein the fluid processing cell comprises a plate member having walls projecting therefrom to contact the substrate to define the plurality of chambers.

3. An apparatus according to claim 2, wherein the plate member has within it a plurality of fluid channels communicating with the chambers.

4. An apparatus according to claim 1, wherein each chamber is elongated and has a fluid inlet at a first end thereof and a fluid outlet at a second end thereof.

5. An apparatus according to claim 4, wherein the height of each chamber decreases from the fluid inlet toward the fluid outlet and capillary forces assist in removal of fluid from the cell.

6. An apparatus according to claim 1, wherein at least one surface of the fluid processing cell is provided with an anti-reflection coating.

7. An apparatus according to claim 1, wherein the height of each chamber is selected so as to minimize reflections of the radiation when a fluid is present in the chamber.

8. An apparatus according to claim 1, wherein the fluid processing cell is integrated into the substrate table.

9. An apparatus according to claim 1, wherein the fluid processing cell is separable from the substrate table and a substrate can be attached to the fluid processing cell before the cell and substrate are together loaded onto the substrate table.

10. An apparatus according to claim 1, wherein the fluid processing cell is separable from the substrate table and is configured to be placed on the substrate, the substrate table, or both.

11. A device manufacturing method, comprising:
providing a substrate to a substrate table in a lithographic projection system;
providing a projection beam of radiation using a radiation system;
patterning the projection beam in its cross-section;
projecting the patterned beam of radiation onto a target portion of a layer of radiation-sensitive material; and
processing an area of the substrate by exposing it to a fluid that interacts therewith to effect a process while the substrate is held by the substrate table, wherein the area of the substrate does not include the target portion and the projecting and processing are carried out at least partially simultaneously.

12. A method according to claim 11, wherein the interaction with the substrate comprises one or more steps selected from the group of:
- a chemical reaction with the substrate surface or compounds thereon;
- removal of part of the substrate or compounds thereon;
- addition of compounds to the substrate;
- washing; and
- modification of the surface or atomic or electronic structure of the substrate or compounds adhered thereto.

13. A method according to claim 11, further comprising a second processing of exposing a second area of the substrate to a second fluid that interacts therewith to effect a second process, the second area being different than the area, the second process being different than the process and the second processing being carried out at least partially simultaneously with the processing.

14. A lithographic apparatus, comprising:
- a patterning structure support that is constructed to support a patterning structure, the patterning structure capable of patterning a beam of radiation;
- a substrate table for holding a substrate;
- a projection system for projecting the patterned beam of radiation onto a target portion of the substrate;
- a fluid processing cell in fluid communication with a surface of a substrate held on the substrate table, the fluid processing cell comprising a plurality of separate chambers configured to not have fluid communication with one another and to simultaneously receive a fluid, wherein each chamber is configured to have fluid communication with a different area of the substrate.

15. A lithographic apparatus according to claim 14, wherein at least two of the chambers receive different fluids for different exposure processes on different areas of the substrate.

16. The lithographic apparatus according to claim 14, wherein the fluid processing cell is configured to subject one area of the substrate to a fluid process and, simultaneously, subject another area of the substrate to a different fluid process, or to subject one area of the substrate to a fluid process and, simultaneously, subject another area of the substrate to a radiation exposure process.

17. The lithographic apparatus according to claim 14, wherein each chamber includes a fluid inlet.

18. The lithographic apparatus according to claim 14, wherein each chamber includes a fluid outlet.

19. A device manufacturing method, comprising:
- providing a substrate;
- projecting a patterned beam of radiation onto a target portion of a layer of radiation-sensitive material on the substrate; and
- processing an area of said substrate by exposing it to a fluid that interacts therewith, the area of the substrate not including the target portion, wherein the projecting and the processing are carried out at least partially simultaneously.

* * * * *